US012680161B2

(12) United States Patent
Seo et al.

(10) Patent No.: US 12,680,161 B2
(45) Date of Patent: Jul. 14, 2026

(54) SEMICONDUCTOR PROCESS SYSTEM AND METHOD OF CLEANING THE SAME

(71) Applicant: SAMSUNG ELECTRONICS CO., LTD., Suwon-si (KR)

(72) Inventors: Ireh Seo, Suwon-si (KR); Chang-Ha Lee, Seoul (KR); Taeung Yoon, Suwon-si (KR); Rak-Young Jeon, Seoul (KR)

(73) Assignees: SAMSUNG ELECTRONICS CO., LTD., Suwon-si (KR); INDUSTRY-ACADEMIC COOPERATION FOUNDATION, UNIVERSITY, Yonsei (KR)

( * ) Notice: Subject to any disclaimer, the term of this patent is extended or adjusted under 35 U.S.C. 154(b) by 462 days.

(21) Appl. No.: 18/202,106

(22) Filed: May 25, 2023

(65) Prior Publication Data

US 2024/0141481 A1 May 2, 2024

(30) Foreign Application Priority Data

Oct. 26, 2022 (KR) ........................ 10-2022-0139458

(51) Int. Cl.
*C23C 16/44* (2006.01)
*C23C 16/52* (2006.01)
*H10P 72/00* (2026.01)

(52) U.S. Cl.
CPC ...... *C23C 16/4405* (2013.01); *C23C 16/4408* (2013.01); *C23C 16/52* (2013.01); *H10P 72/0414* (2026.01)

(58) Field of Classification Search
None
See application file for complete search history.

(56) References Cited

U.S. PATENT DOCUMENTS

| | | | |
|---|---|---|---|
| 6,698,469 | B2 | 3/2004 | Sakamoto et al. |
| 10,586,721 | B2 | 3/2020 | Murata et al. |
| 11,201,054 | B2 | 12/2021 | Isobe |
| 2018/0179628 | A1 | 6/2018 | Hashimoto et al. |
| 2019/0368036 | A1 | 12/2019 | Kuribayashi et al. |
| 2021/0205861 | A1 | 7/2021 | Cheng et al. |

FOREIGN PATENT DOCUMENTS

| | | |
|---|---|---|
| KR | 10-1994-0004737 A | 3/1994 |
| KR | 10-2005-0008186 A | 1/2005 |
| KR | 10-2072621 B1 | 2/2020 |

*Primary Examiner* — Eric W Golightly
(74) *Attorney, Agent, or Firm* — Sughrue Mion, PLLC

(57) ABSTRACT

A method of cleaning a semiconductor processing system may include applying a vacuum pressure to a supply pipeline through which a process fluid is transferred to a process chamber and purging the supply pipeline with a cleaning gas, wherein the purging the supply pipeline with the cleaning gas includes by supplying the cleaning gas to a front end of the supply pipeline and discharging the cleaning gas supplied to the supply pipeline by applying an atmospheric pressure from a back end of the supply pipeline.

12 Claims, 20 Drawing Sheets

SEMICONDUCTOR PROCESS SYSTEM AND METHOD OF CLEANING THE SAME

CROSS-REFERENCE TO RELATED APPLICATION

This application is based on and claims priority to Korean Patent Application No. 10-2022-0139458, filed on Oct. 26, 2022, in the Korean Intellectual Property Office, the disclosure of which is incorporated herein by reference in its entirety.

BACKGROUND

1. Field

The disclosure relates to a semiconductor process system and a method of cleaning the same, and more particularly, to a semiconductor process system capable of cleaning out a residual fluid and a method of cleaning the same.

2. Description of Related Art

A semiconductor device may be fabricated by using various processes. For example, a semiconductor device may be fabricated through a photolithography process, an etching process, a deposition process, and so forth performed on a substrate. Various kinds of fluid may be used in semiconductor fabrication process. A fluid may be supplied from a supply apparatus through pipelines to a semiconductor process chamber. The pipelines may require maintenance or replacement after a certain time of use. It may be necessary to disassemble the pipelines for maintenance or replacement. Prior to the disassembly of the pipelines, an operation may be conducted to remove fluid remaining in the pipelines.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

Provided are a semiconductor process system that may clean out a residual fluid to secure worker's safety and a method of cleaning the same.

Provided are a semiconductor process system that may promptly remove a residual fluid to reduce work time and a method of cleaning the same.

Provided are a semiconductor process system that may effectively remove a residual fluid in a remote place thereof and a method of cleaning the same.

Provided are a semiconductor process system that may be implemented with simple equipment and a method of cleaning the same.

Additional aspects will be set forth in part in the description which follows and, in part, will be apparent from the description, or may be learned by practice of the presented embodiments.

According to an aspect of an example embodiment, a method of cleaning a semiconductor processing system may include applying a vacuum pressure to a supply pipeline through which a process fluid is transferred to a process chamber and purging the supply pipeline with a cleaning gas, where the purging the supply pipeline with the cleaning gas may include supplying the cleaning gas to a front end of the supply pipeline and discharging the cleaning gas supplied to the supply pipeline by applying an atmospheric pressure from a back end of the supply pipeline.

According to an aspect of an example embodiment, a method of cleaning a semiconductor processing system may include applying a vacuum pressure to a supply pipeline connected to a process chamber; and purging the supply pipeline with a cleaning gas, where the purging the supply pipeline with the cleaning gas may include supplying the supply pipeline with the cleaning gas at a first pressure and discharging the cleaning gas supplied to the supply pipeline by applying a second pressure, where the applying the vacuum pressure and the purging the supply pipeline are sequentially and repeatedly performed at least three times and the supplying the cleaning gas and the discharging the cleaning gas are performed at substantially the same time.

According to an aspect of an example embodiment, a semiconductor processing system may include a process fluid supply, a process chamber configured to receive a process fluid from the process fluid supply, a manifold between the process fluid supply and the process chamber, a scrubber configured to purify the process fluid that is discharged from the process chamber, a vacuum pump between the process chamber and the scrubber, a cleaning gas supply connected to the manifold, and configured to provide the manifold with a cleaning gas, and a bypass pipeline that connects the manifold to the scrubber and is configured to bypass the vacuum pump.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
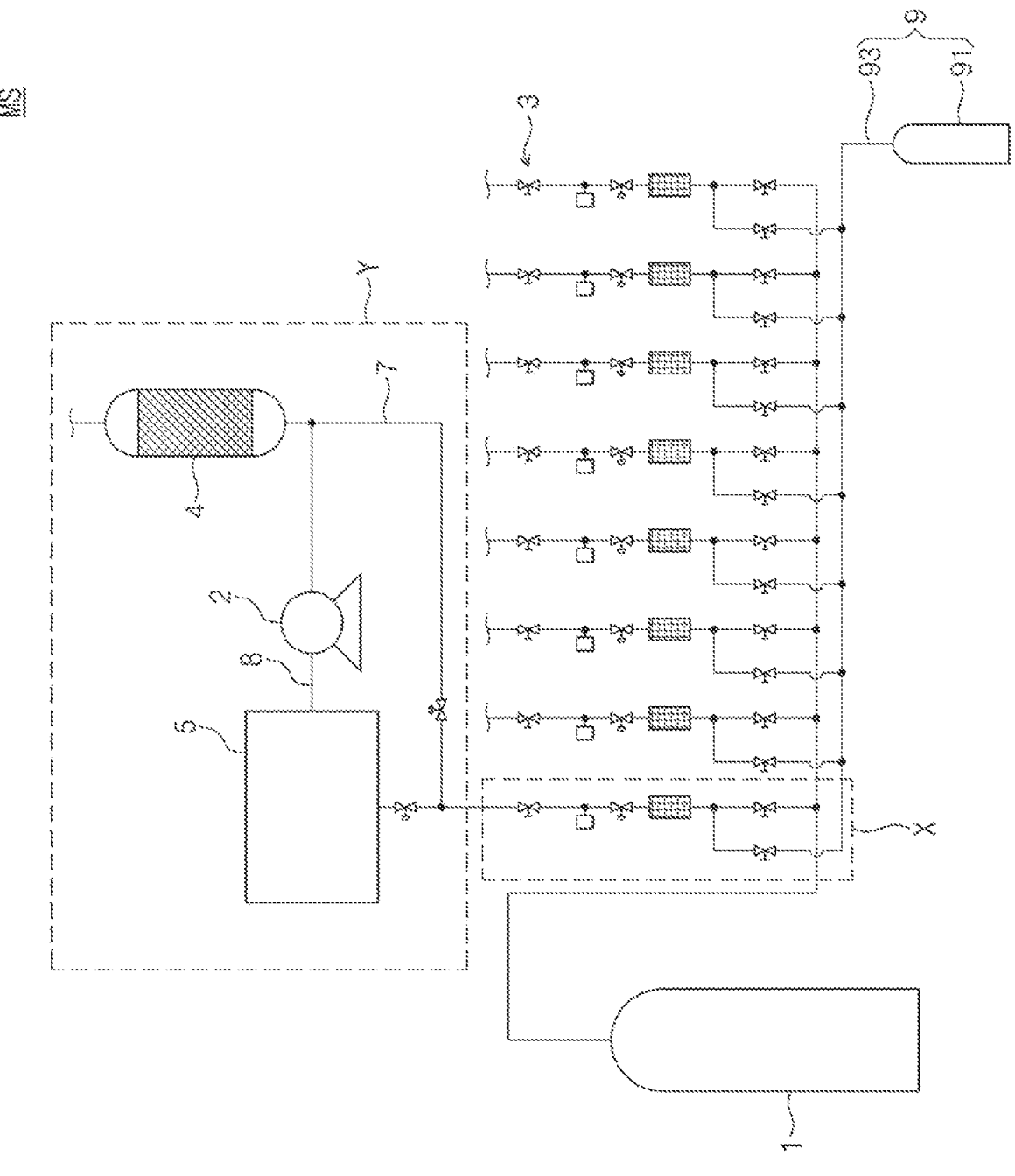
FIG. 1 is a diagram showing a semiconductor process system according to some embodiments of the disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a diagram showing a semiconductor process system according to some embodiments of the disclosure.

Referring to FIG. 1, a semiconductor process system MS may be provided. The semiconductor process system MS may be a system that performs processes for fabricating a semiconductor device. For example, the semiconductor process system MS may be configured to allow a substrate to undergo one or more of a photolithography process, an etching process, a deposition process, and a cleaning process. A term "substrate" used in this description may denote a silicon (Si) wafer, but the disclosure is not limited thereto. Various kinds of fluid may be used in semiconductor fabrication process. For example, a fluid may be sprayed onto a substrate, and a certain process may be performed on the substrate. A fluid used for semiconductor fabrication process may be called a process fluid. To supply the process fluid, the semiconductor process system MS may include a process fluid supply 1, a manifold 3, a process chamber 5, an exhaust pipeline 8, a vacuum pump 2, a scrubber 4, a bypass pipeline 7, and a cleaning gas supply 9.

The process fluid supply 1 may supply the process chamber 5 with the process fluid. The process fluid supply 1 may include a process fluid storage tank, a compressor, and a pump. The process fluid supply 1 may supply the process fluid to each of a plurality of process chambers 5, but the disclosure is not limited thereto. The process fluid supplied from the process fluid supply 1 may be a gas required for semiconductor fabrication process. For example, the process fluid supply 1 may supply the process chamber 5 with one or more of HCl, $WF_6$, $NH_3$, and $SiCl_4$. For example, the process fluid may include one or more of HCl, $WF_6$, $NH_3$, and $SiCl_4$. The disclosure, however, are not limited thereto, and the process fluid may include different kinds of gas.

The manifold 3 may be positioned between the process fluid supply 1 and the process chamber 5. The manifold 3 may connect the process fluid supply 1 to the process chamber 5. For example, the process fluid supplied from the process fluid supply 1 may be transferred through the manifold 3 to the process chamber 5. The manifold 3 may be connected to each of the plurality of process chambers 5. For example, the process fluid supplied from one process fluid supply 1 may be diverged while passing through the manifold 3, and then may be supplied to each of the plurality of process chambers 5. The manifold 3 will be further discussed in detail below.

The process chamber 5 may be a chamber where a semiconductor fabrication process is performed. The process chamber 5 may be configured such that a substrate is allowed to undergo one or more of a photolithography process, an etching process, a deposition process, and a cleaning process. The process chamber 5 may be supplied with the process fluid from the process fluid supply 1, and a semiconductor fabrication process may be performed on a substrate. The process chamber 5 may include one or more of an exposure apparatus, an etching apparatus, a deposition apparatus, and a cleaning apparatus. A detailed description thereof will be further discussed below. The system MS may include a plurality of process chambers 5. Each of the plurality of process chambers 5 may be supplied with the process fluid from the process fluid supply 1. For example, each of the plurality of process chambers 5 may be supplied with the process fluid branched from the manifold 3. Each of the plurality of process chambers 5 may be connected to the manifold 3. Unless otherwise specified, a single process chamber 5 will be discussed below.

The exhaust pipeline 8 may be connected to a back end of the process chamber 5. The process fluid supplied to the process chamber 5 may be discharged through the exhaust pipeline 8 from the process chamber 5.

The vacuum pump 2 may be connected behind the process chamber 5. For example, the vacuum pump 2 may be connected through the exhaust pipeline 8 to the process chamber 5. The vacuum pump 2 may provide a vacuum pressure. The vacuum pump 2 may inhale fluid inside the process chamber 5.

The scrubber 4 may be connected behind the process chamber 5. For example, the scrubber 4 may be connected behind the process chamber 5 and the vacuum pump 2. The process fluid discharged from the process chamber 5 may pass through the scrubber 4. When a fluid passes through the scrubber 4, a harmful constituent may be removed from the fluid. Therefore, the process fluid discharged from the process chamber 5 may be purified while passing through the scrubber 4. The scrubber 4 may include a fluid spray nozzle and a packaging structure.

The bypass pipeline 7 may bypass the vacuum pump 2. For example, the bypass pipeline 7 may bypass the vacuum pump 2 to connect the manifold 3 to the scrubber 4. The bypass pipeline 7 may also bypass the process chamber 5. For example, one end of the bypass pipeline 7 may be directly connected to the manifold 3. Another end of the bypass pipeline 7 may be connected between the vacuum pump 2 and the scrubber 4. A detailed description thereof will be further discussed below.

The cleaning gas supply 9 may be connected to the manifold 3. The cleaning gas supply 9 may supply the manifold 3 with cleaning gas. The cleaning gas supply 9 may purge at least a portion of the manifold 3. For example, the manifold 3 may be purged with the cleaning gas supplied from the cleaning gas supply 9. The cleaning gas may include nitrogen ($N_2$), but the disclosure is not limited thereto. The cleaning gas supply 9 may include a cleaning gas tank 91 and a connection pipeline 93. The cleaning gas tank 91 may store and supply the cleaning gas. The connection pipeline 93 may connect the cleaning gas tank 91 to the manifold 3. A detailed description thereof will be further discussed below.

Figure 2:
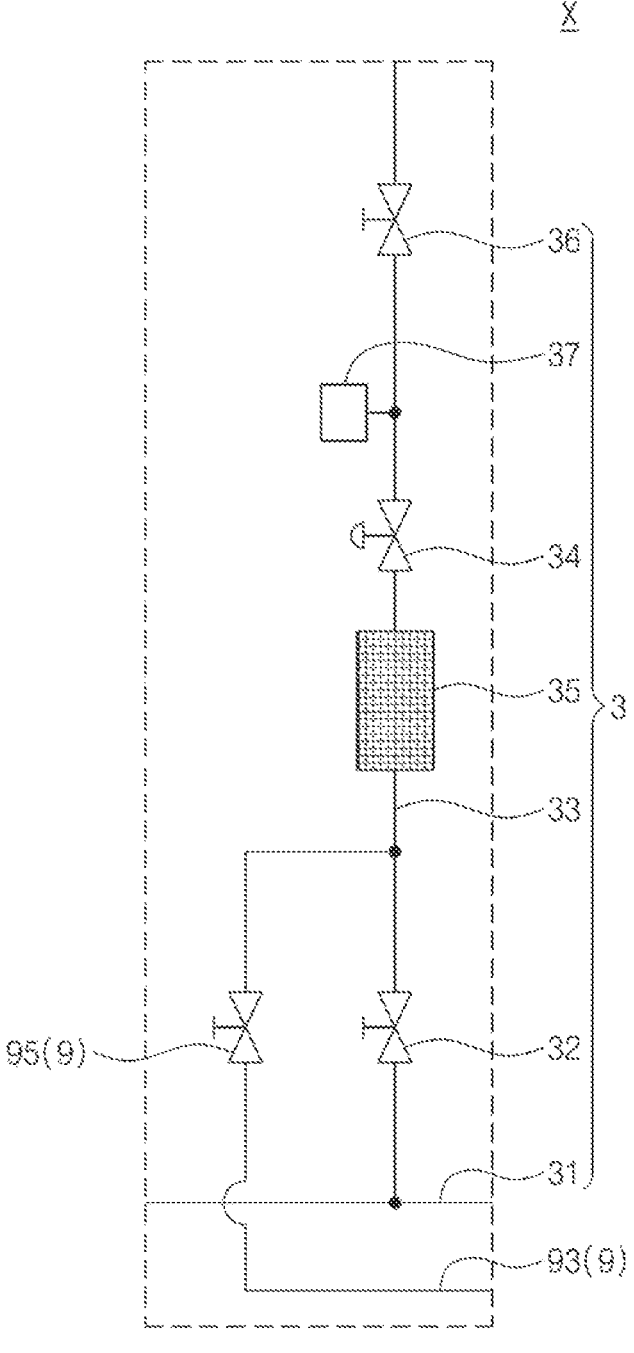
FIG. 2 is a diagram showing section X of FIG. 1 according to some embodiments of the disclosure.

FIG. 2 is a diagram showing section X of FIG. 1 according to some embodiments of the disclosure.

Figure 3:
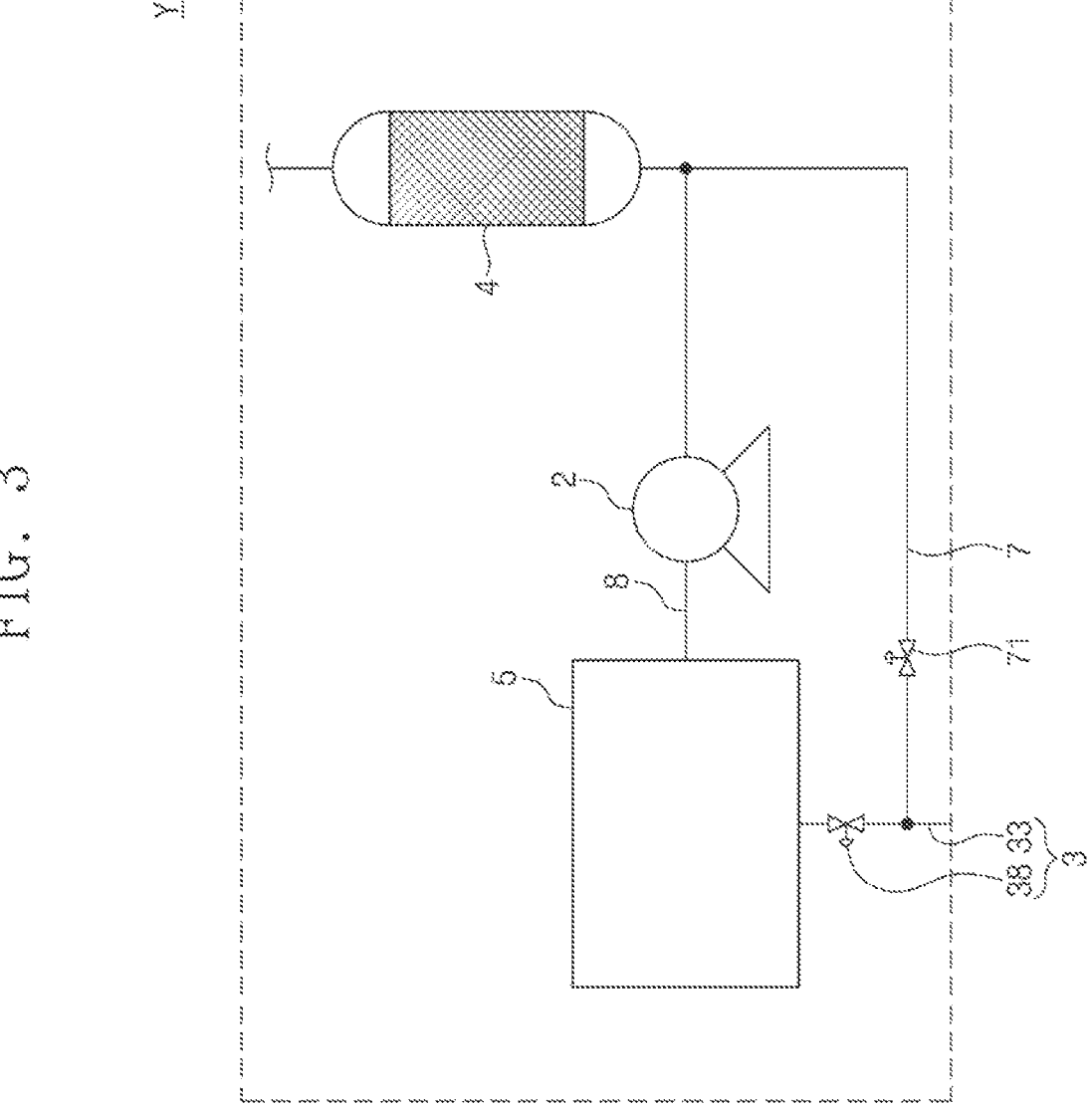
FIG. 3 is a diagram showing section Y of FIG. 1 according to some embodiments of the disclosure.

Referring to FIG. 2, the manifold 3 may include a main pipeline 31, a supply pipeline 33, a first valve 32, a filter 35, a regulator 34, a pressure sensor 37, a second valve 36, and a shutoff valve (e.g., shutoff valve 38 of FIG. 3).

The main pipeline 31 may be connected to the process fluid supply 1. The main pipeline 31 may provide the supply pipeline 33 with the process fluid supplied from the process fluid supply 1.

The supply pipeline 33 may be connected to the main pipeline 31. The supply pipeline 33 may connect the main pipeline 31 to the process chamber 5. The process fluid that moves along the main pipeline 31 may be supplied though the supply pipeline 33 to the process chamber 5.

The first valve 32 may be positioned on the supply pipeline 33. A flow of the process fluid that moves along the supply pipeline 33 may be shut off depending on whether the first valve 32 is opened or closed. The first valve 32 may include a manual valve, but the disclosure is not limited thereto.

The filter 35 may be positioned on the supply pipeline 33. The filter 35 may filter foreign substances from the process fluid that moves along the supply pipeline 33.

The regulator 34 may be positioned on the supply pipeline 33. The regulator 34 may be located behind the filter 35. For example, the regulator 34 may be positioned between the filter 35 and the pressure sensor 37. A flow of the process fluid that moves along the supply pipeline 33 may be controlled depending on whether the regulator 34 is opened or closed. For example, the regulator 34 may adjust a pressure and/or flow rate of the process fluid that moves along the supply pipeline 33.

The pressure sensor 37 may be positioned on the supply pipeline 33. The pressure sensor 37 may measure a pressure of the process fluid in the supply pipeline 33. The pressure sensor 37 may be located behind the filter 35, but the disclosure is not limited thereto.

The second valve 36 may be positioned on the supply pipeline 33. The second valve 36 may be located behind the pressure sensor 37. For example, the second valve 36 may be positioned between the pressure sensor 37 and the shutoff valve 38. A flow of the process fluid that moves along the supply pipeline 33 may be shut off depending on whether the second valve 36 is opened or closed. The second valve 36 may include a manual valve, but the disclosure is not limited thereto.

The shutoff valve 32 may be positioned on the supply pipeline 33. The shutoff valve 38 may be located behind the second valve 36. For example, the shutoff valve 38 may be positioned between the bypass pipeline (e.g., bypass pipeline 7 of FIG. 3) and the process chamber 5. The shutoff valve 38 may include an automatic valve, but the disclosure is not limited thereto.

The connection pipeline 93 may connect the cleaning gas tank 91 to the manifold 3. For example, the connection pipeline 93 may connect the cleaning gas tank 91 to the supply pipeline 33. The connection pipeline 93 may be connected to the supply pipeline 33 between the first valve 32 and the filter 35, but the disclosure is not limited thereto.

The cleaning gas supply 9 may further include a purge valve 95. The purge valve 95 may be positioned on the connection pipeline 93. A flow of the process fluid that moves along the connection pipeline 93 may be shut off depending on whether the purge valve 95 is opened or closed. The purge valve 95 may include a manual valve, but the disclosure is not limited thereto.

FIG. 3 is a diagram showing section Y of FIG. 1 according to some embodiments of the disclosure.

Referring to FIG. 3, the bypass pipeline 7 may connect the manifold 3 to the scrubber 4. For example, the bypass pipeline 7 may connect the supply pipeline 33 to the scrubber 4. One end of the bypass pipeline 7 may be connected to the supply pipeline 33 between the shutoff valve 38 and the second valve 36. Another end of the bypass pipeline 7 may be connected to the exhaust pipeline 8 between the vacuum pump 2 and the scrubber 4.

A bypass valve 71 may be provided on the bypass pipeline 7. A flow of the process fluid that moves along the bypass pipeline 7 may be shut off depending on whether the bypass valve 71 is opened or closed. The bypass valve 71 may include an automatic valve, but the disclosure is not limited thereto.

Figure 4:
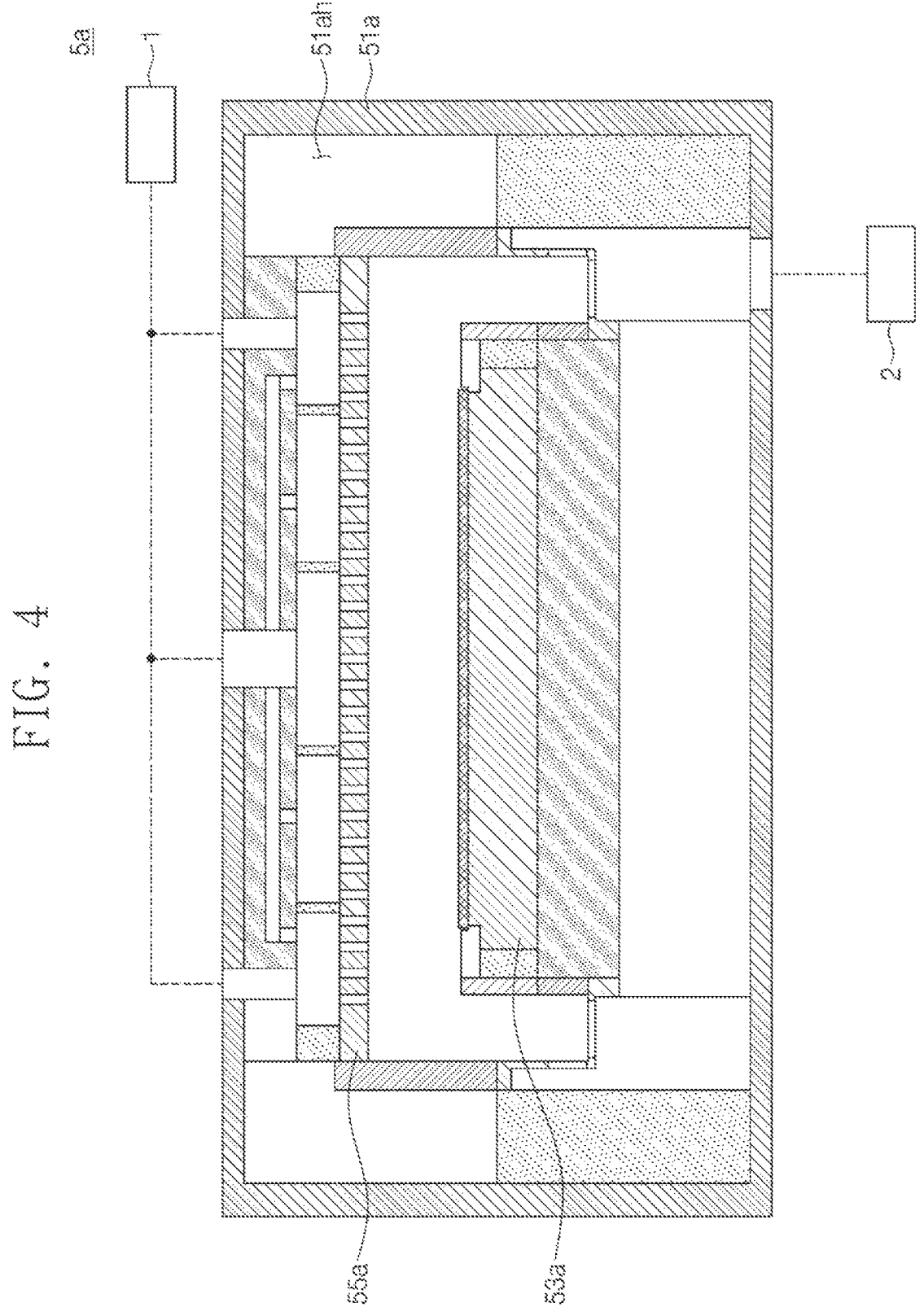
FIG. 4 is a cross-sectional view showing a process chamber of a semiconductor process system according to some embodiments of the disclosure.

FIG. 4 is a cross-sectional view showing a process chamber of a semiconductor process system according to some embodiments of the disclosure.

Referring to FIG. 4, a process chamber 5a may be provided. The process chamber 5a of FIG. 4 may be an example of the process chamber 5 discussed with reference to FIG. 1. The process chamber 5a of FIG. 4 may be an apparatus configured to perform a substrate etching process. For example, the process chamber 5a may be an etching chamber. The process chamber 5a may include an etching housing 51a, an etching chuck 53a, and a showerhead 55a. The etching housing 51a may provide an etching space 51ah in which an etching process is performed. The etching chuck 53a may support a substrate. The showerhead 55a may be upwardly spaced apart from the etching chuck 53a. The process fluid supplied from the process fluid supply 1 may be sprayed through the showerhead 55a onto a substrate fixed to the etching chuck 53a. The vacuum pump 2 may force the process fluid in the etching space 51ah to escape from the etching housing 51a.

Figure 5:
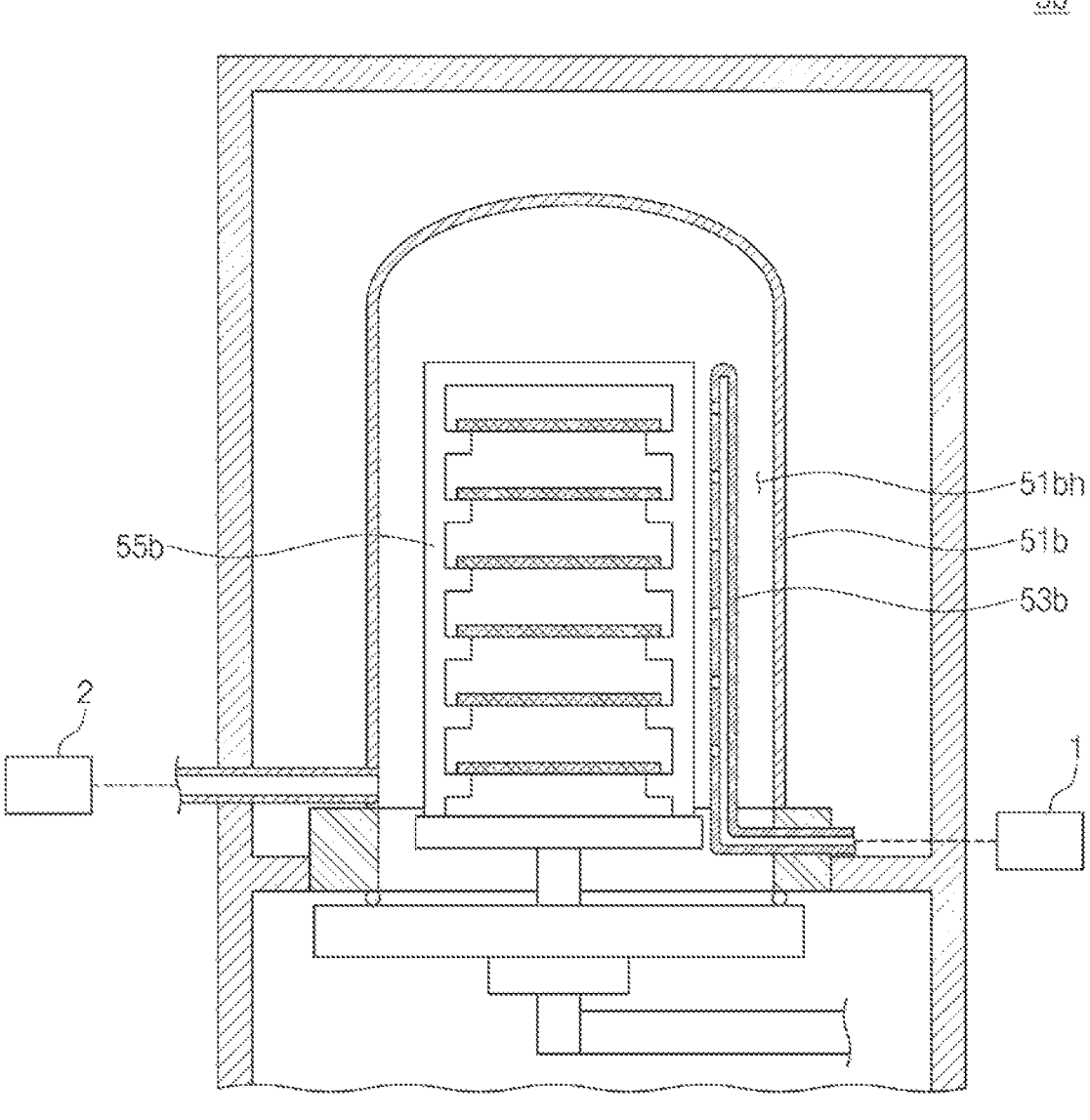
FIG. 5 is a cross-sectional view showing a process chamber of a semiconductor process system according to some embodiments of the disclosure.

FIG. 5 is a cross-sectional view showing a process chamber of a semiconductor process system according to some embodiments of the disclosure.

Referring to FIG. 5, a process chamber 5b may be provided. The process chamber 5b of FIG. 5 may be an example of the process chamber 5 discussed with reference to FIG. 1. The process chamber 5b of FIG. 5 may be an apparatus configured to perform a substrate deposition process. For example, the process chamber 5b may be a deposition chamber. The process chamber 5b may include a deposition tube 51b, a deposition nozzle 53b, and a boat 55b. The deposition tube 51b may provide a deposition space 51bh in which a deposition process is performed. The deposition nozzle 53b may be connected to the process fluid supply 1. The deposition nozzle 53b may vertically extend. The process fluid supplied from the process fluid supply 1 may be sprayed through the deposition nozzle 53b onto the boat 55b. The boat 55b may support a substrate. In some embodiments, the boat 55b may support a plurality of substrates. The process fluid supplied from the process fluid supply 1 may be sprayed through the deposition nozzle 53b onto the substrate supported on the boat 55b. The vacuum pump 2 may force the process fluid in the deposition space 51bh to escape from the deposition tube 51b.

Figure 6:
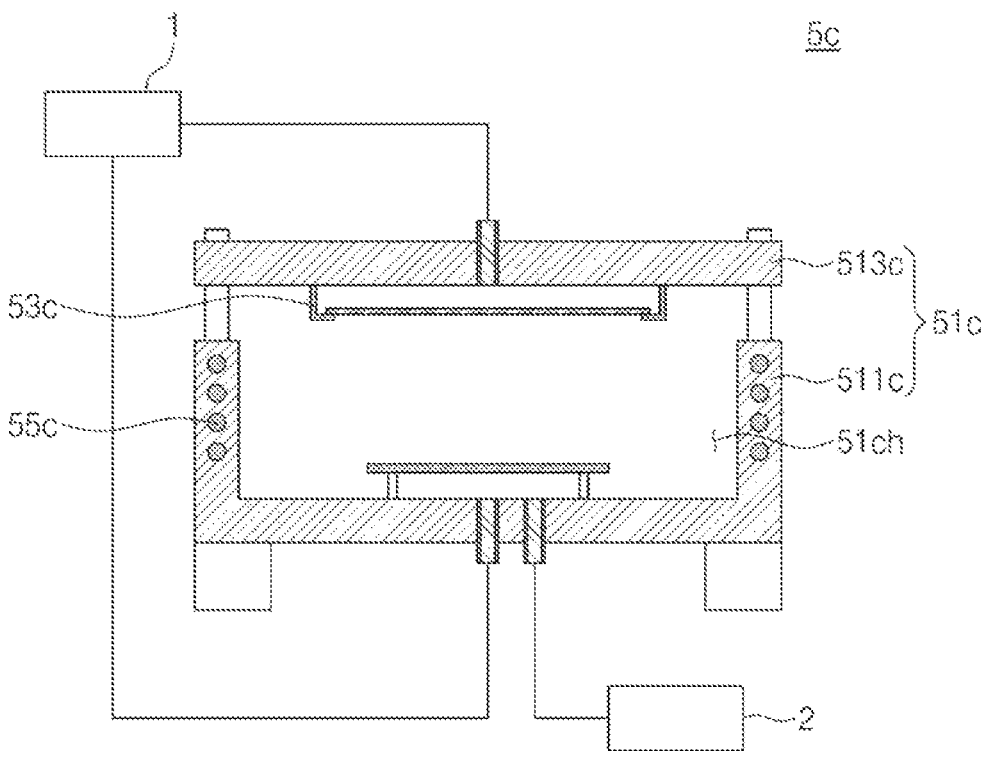
FIG. 6 is a cross-sectional view showing a process chamber of a semiconductor process system according to some embodiments of the disclosure.

FIG. 6 is a cross-sectional view showing a process chamber of a semiconductor process system according to some embodiments of the disclosure.

Referring to FIG. 6, a process chamber 5c may be provided. The process chamber 5c of FIG. 6 may be an example of the process chamber 5 discussed with reference to FIG. 1. The process chamber 5c of FIG. 6 may be an apparatus configured to perform a substrate cleaning process. For example, the process chamber 5c may be a cleaning chamber. The process chamber 5*c* may include a cleaning housing 51*c*, a cleaning chuck 53*c*, and a heater 55*c*. The cleaning housing 51*c* may provide a cleaning space 51*ch* in which a cleaning process is performed. The cleaning housing 51*c* may include a lower housing 511*c* and an upper housing 513*c*. The lower housing 511*c* may vertically move to combine with the upper housing 513*c*. When the lower housing 511*c* is combined with the upper housing 513*c*, the cleaning space 51*ch* may be hermetically sealed from the outside environment. The cleaning chuck 53*c* may support a substrate. The heater 55*c* may heat the cleaning space 51*ch*. The process fluid supplied from the process fluid supply 1 may be sprayed onto a substrate fixed to the cleaning chuck 53*c*. The vacuum pump 2 may force the process fluid in the cleaning space 51*ac* to escape from the cleaning housing 51*c*.

Figure 7:
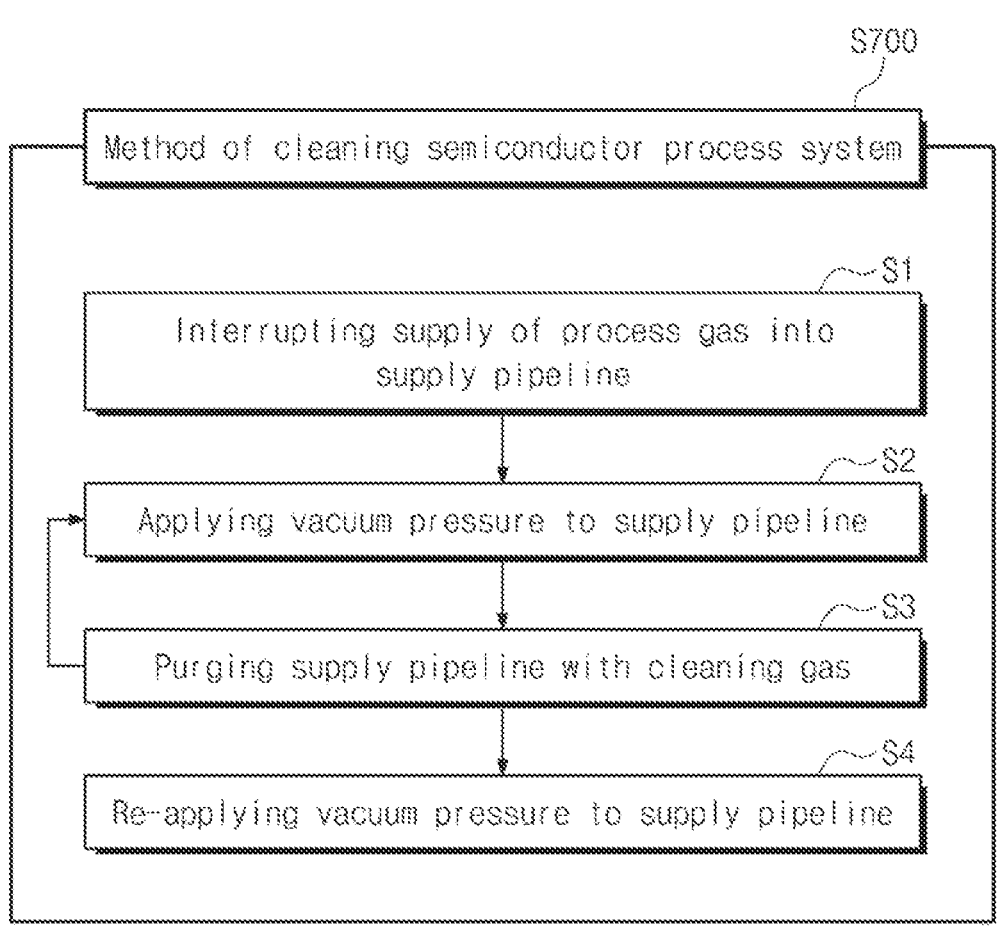
FIG. 7 is a flowchart of a method of cleaning a semiconductor process system according to some embodiments of the disclosure.

FIG. 7 is a flowchart of a method of cleaning a semiconductor process system according to some embodiments of the disclosure.

Referring to FIG. 7, a method S700 of cleaning a semiconductor process system may be provided. The cleaning method S700 may be a method of cleaning at least a portion of the semiconductor process system MS discussed with reference to FIGS. 1 to 6. For example, the cleaning method S700 may be a way of removing a process fluid that remains in the semiconductor process system MS prior to replacement and/or maintenance of at least a portion of the semiconductor process system MS. The cleaning method S700 may include interrupting the supply of process gas into a supply pipeline in operation 51, applying a vacuum pressure to the supply pipeline in operation S2, purging the supply pipeline with a cleaning gas in operation S3, and re-applying a vacuum pressure to the supply pipeline in operation S4.

With reference to FIGS. 8 to 19, the following will describe in detail the semiconductor process system cleaning method S700 according to the flowchart of FIG. 7.

FIGS. 8, 9, 10, 11, 12, 13, 14, 15 and 16 are diagrams showing a method of cleaning a semiconductor process system in accordance with the flowchart of FIG. 7 according to some embodiments of the disclosure.

Figure 8:
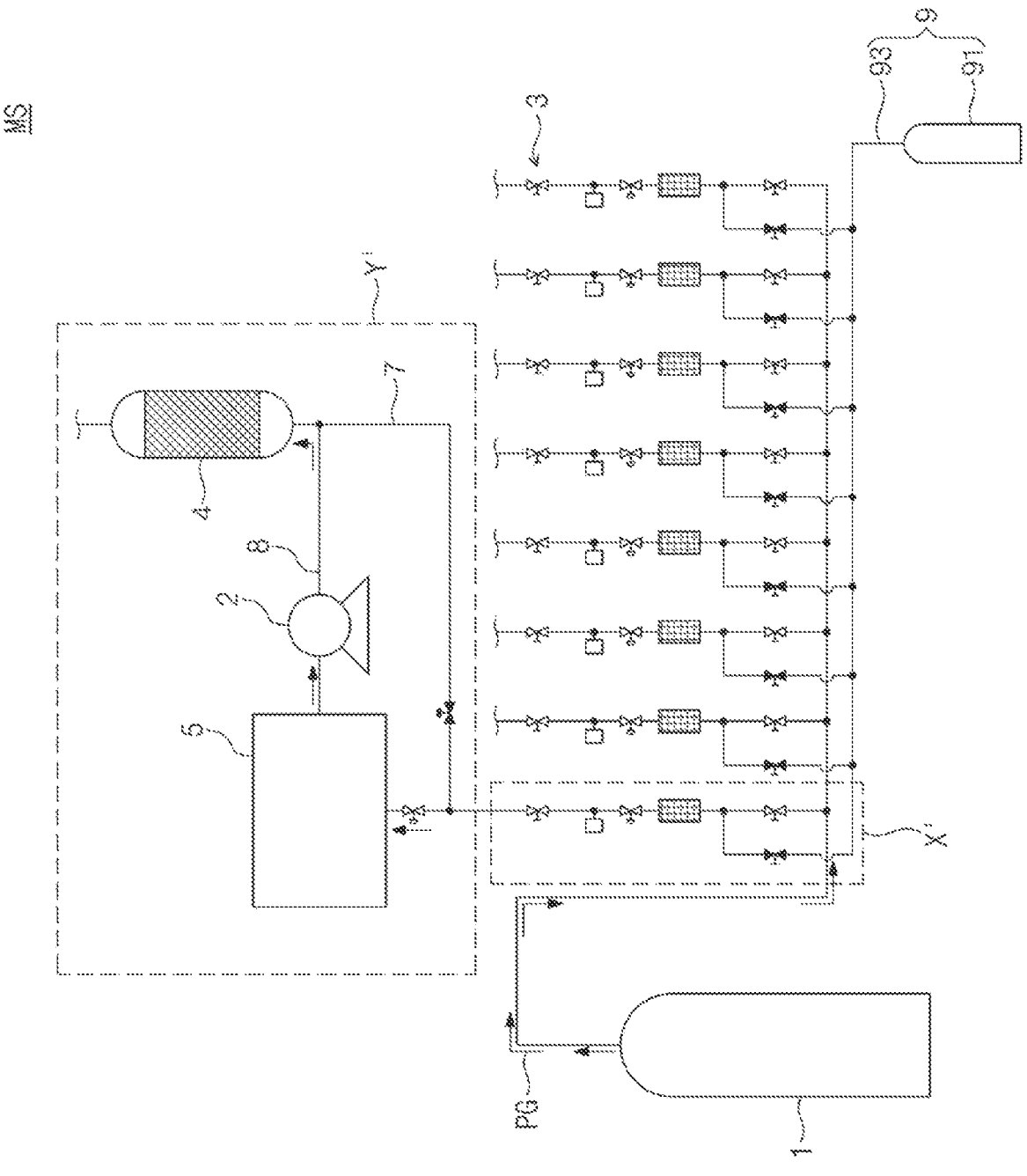
FIGS. 8, 9, 10, 11, 12, 13, 14, 15 and 16 are diagrams showing a method of cleaning a semiconductor process system in accordance with the flowchart of FIG. 7 according to some embodiments of the disclosure.
Figure 9:
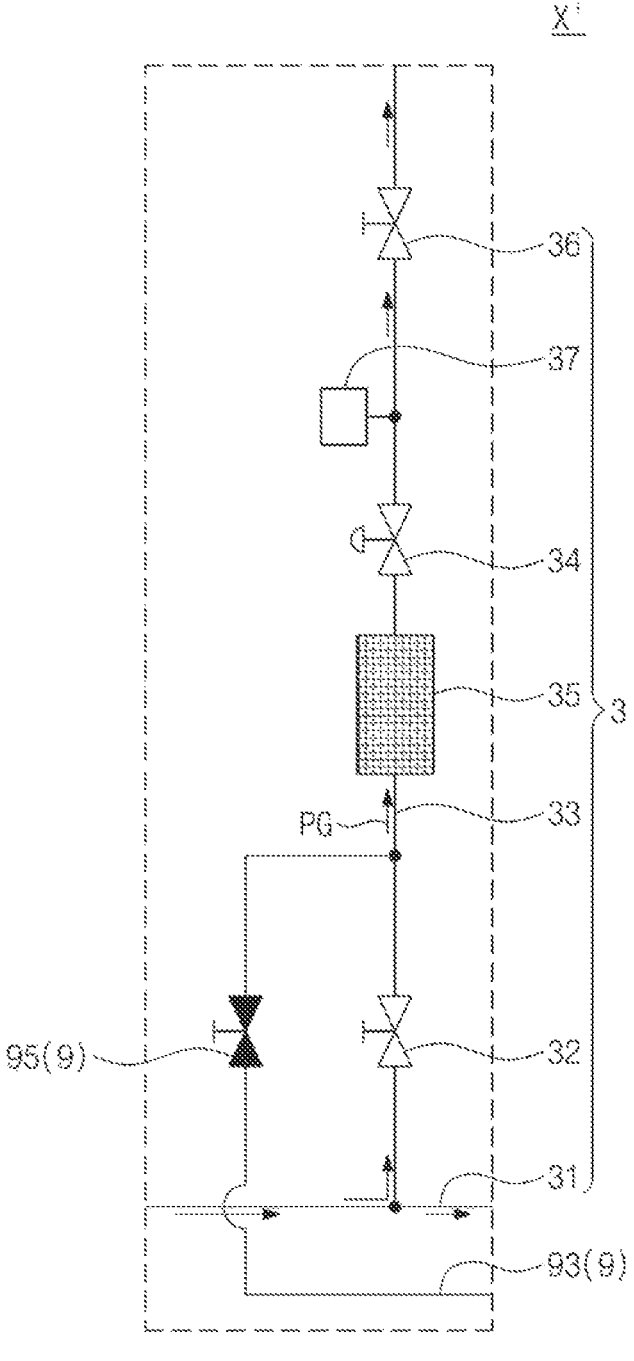
Figure 10:
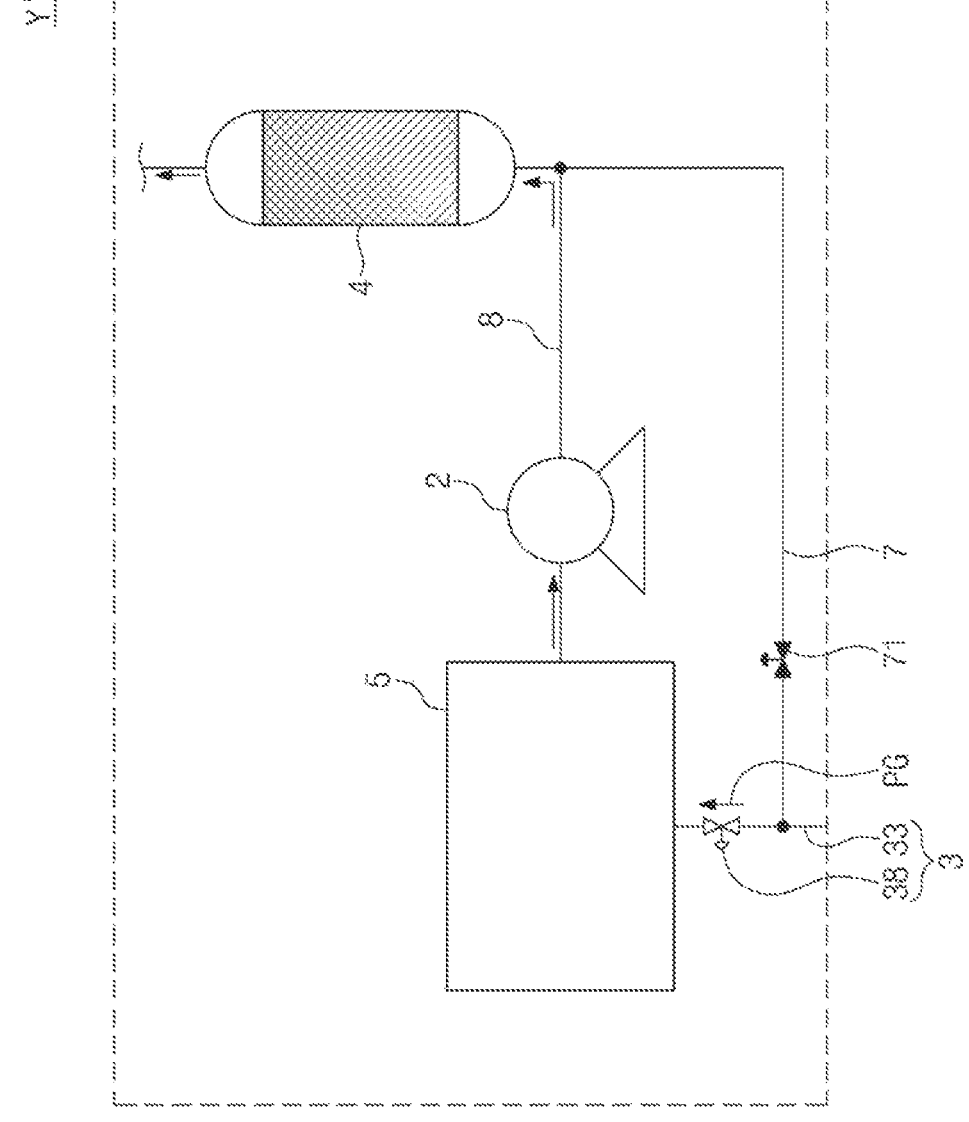
Figure 11:
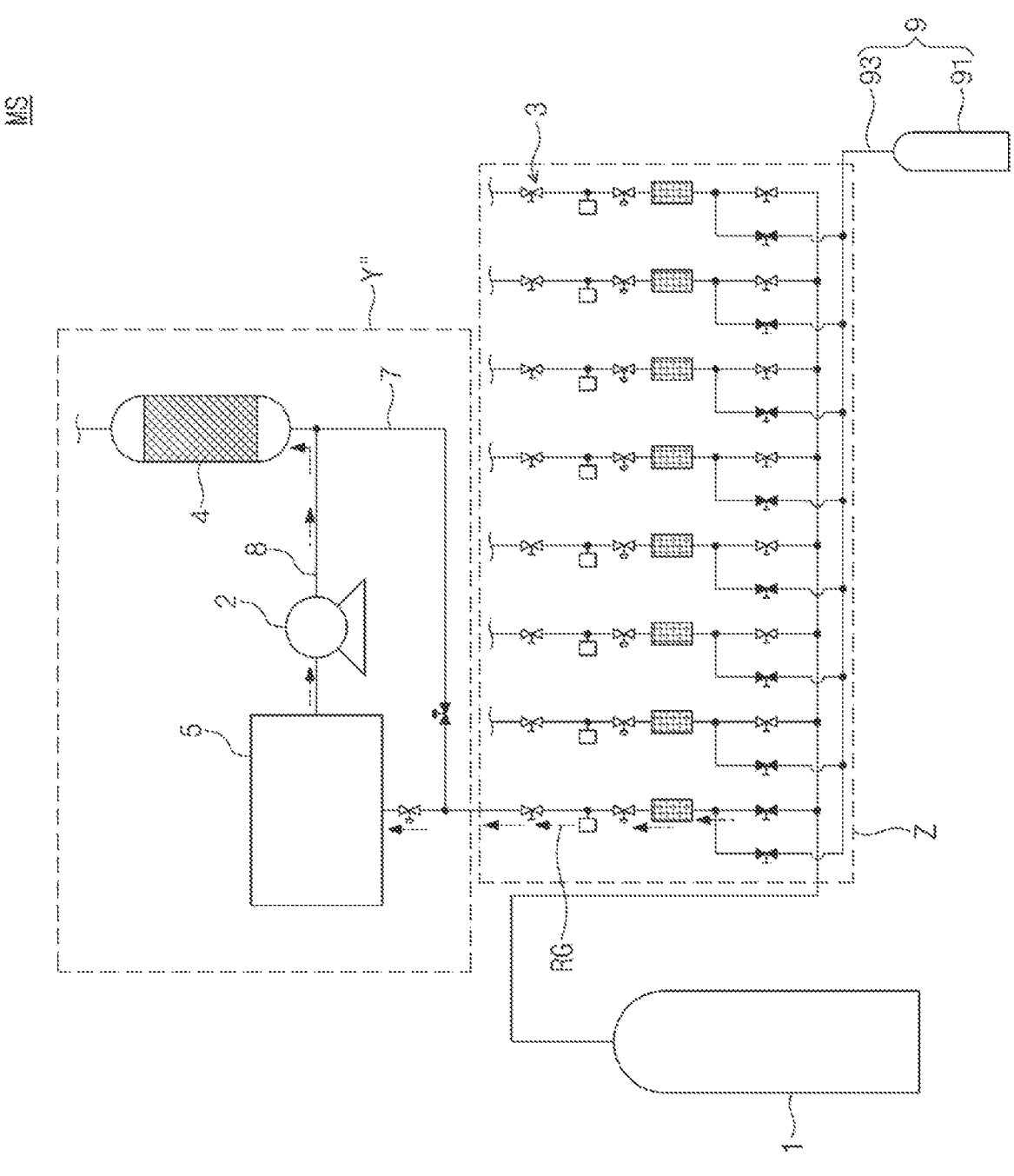
Figure 12:
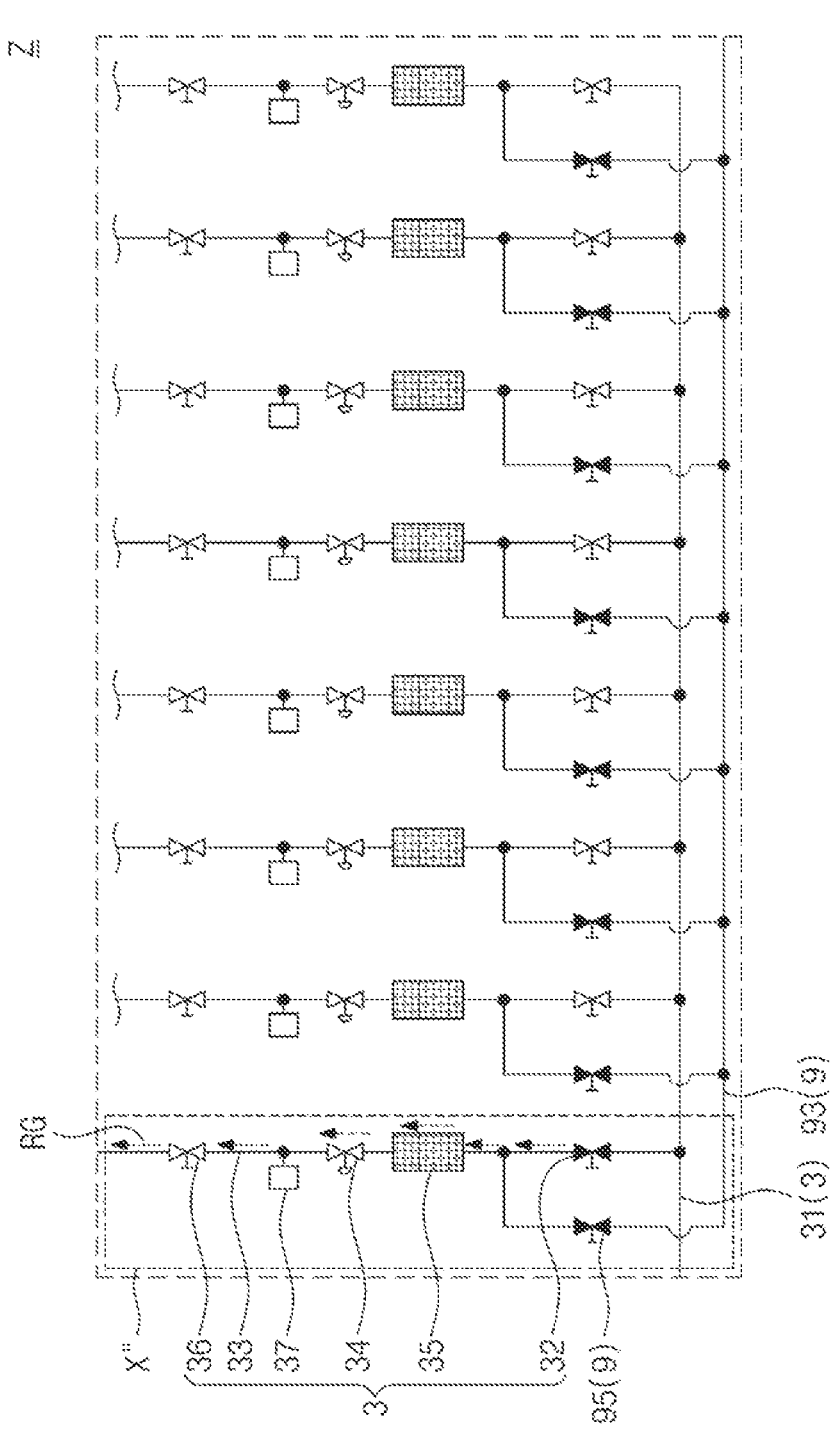
Figure 13:
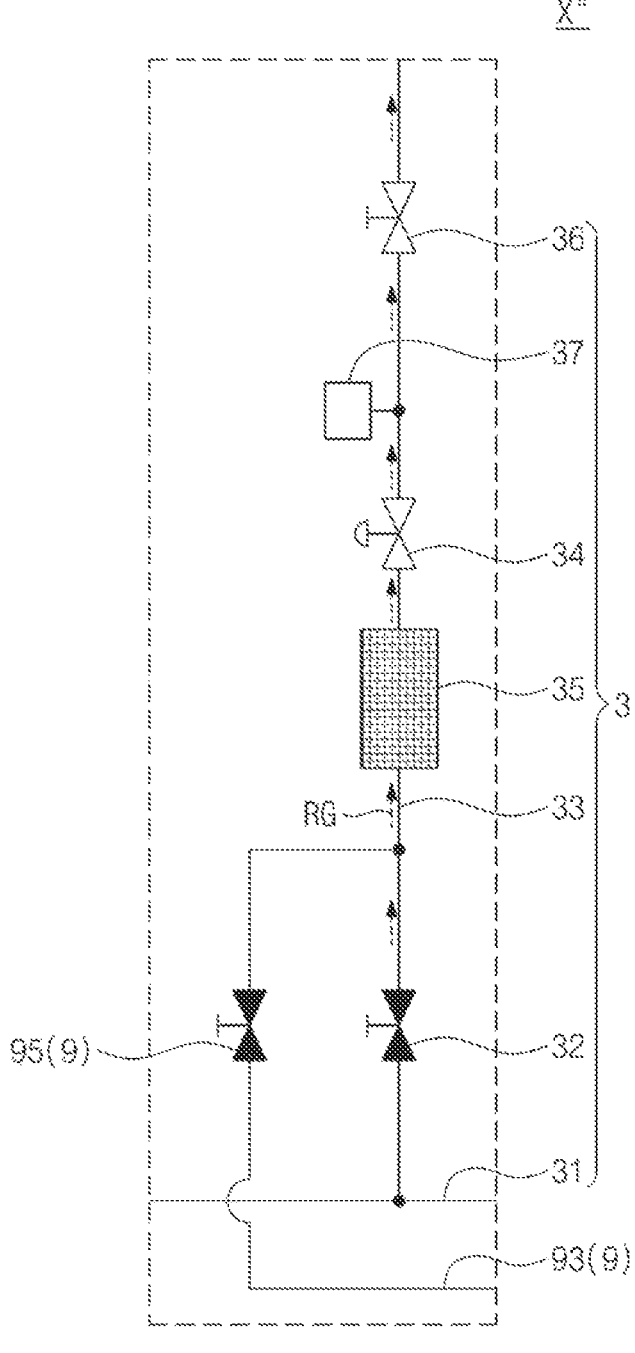
Figure 14:
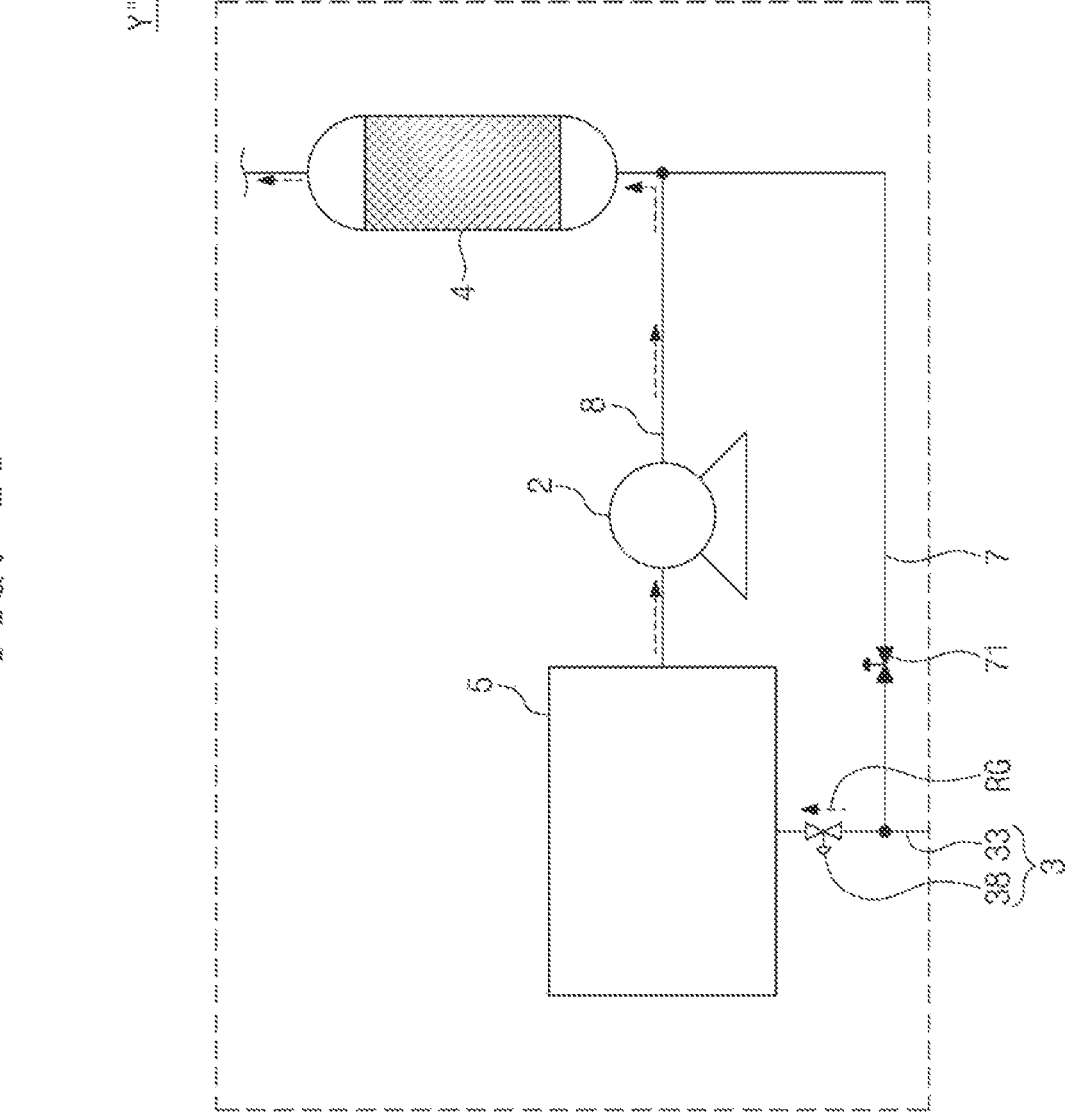

Referring to FIGS. 8, 9 and 10, a process fluid PG may be supplied from the process fluid supply 1. The process fluid PG may be supplied to the process chamber 5 through the main pipeline 31 and the supply pipeline 33. In this operation, the purge valve 95 may be in a closed state. The first valve 32, the regulator 34, the second valve 36, and the shutoff valve 38 may be in their open states. The bypass valve 71 may be in a closed state. The process fluid PG may be used to perform a certain process in the process chamber 5. The vacuum pump 2 may discharge the process fluid PG from the process chamber 5. The process fluid PG discharged from the process chamber 5 may pass through the scrubber 4 and may then be outwardly discharged.

Referring to FIGS. 7 and 11, 12, 13 and 14, the supply interruption operation S1 may include closing the first valve 32 on one of a plurality of supply pipelines 33 which requires cleaning. An open state may be set to a first valve positioned on a supply pipeline which requires no cleaning. Therefore, the supply of the process fluid PG may be interrupted only in the supply pipeline 33 which requires cleaning. A process may be continuously performed in a process chamber connected to another supply pipeline.

The vacuum application operation S2 may be performed in a state that the first valve 32 is closed. In this operation, the purge valve 95 may be in a closed state. The regulator 34, the second valve 36, and the shutoff valve 38 may be in their open states. The bypass valve 71 may be in a closed state.

The vacuum pump 2 may provide the supply pipeline 33 with vacuum pressure. For example, the vacuum application operation S2 may be performed by using the vacuum pump 2. The vacuum pressure may pump a residual fluid RG from the supply pipeline 33. It may thus be possible to remove fluid that remains in the supply pipeline 33.

Figure 15:
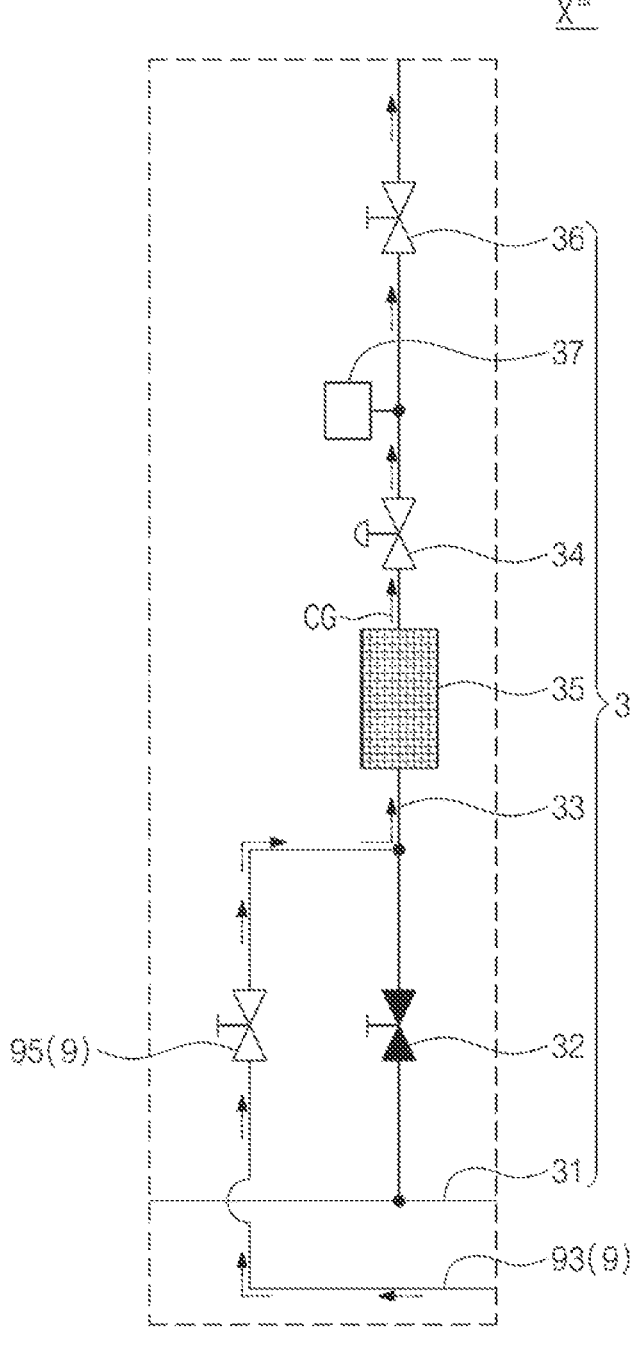
Figure 16:
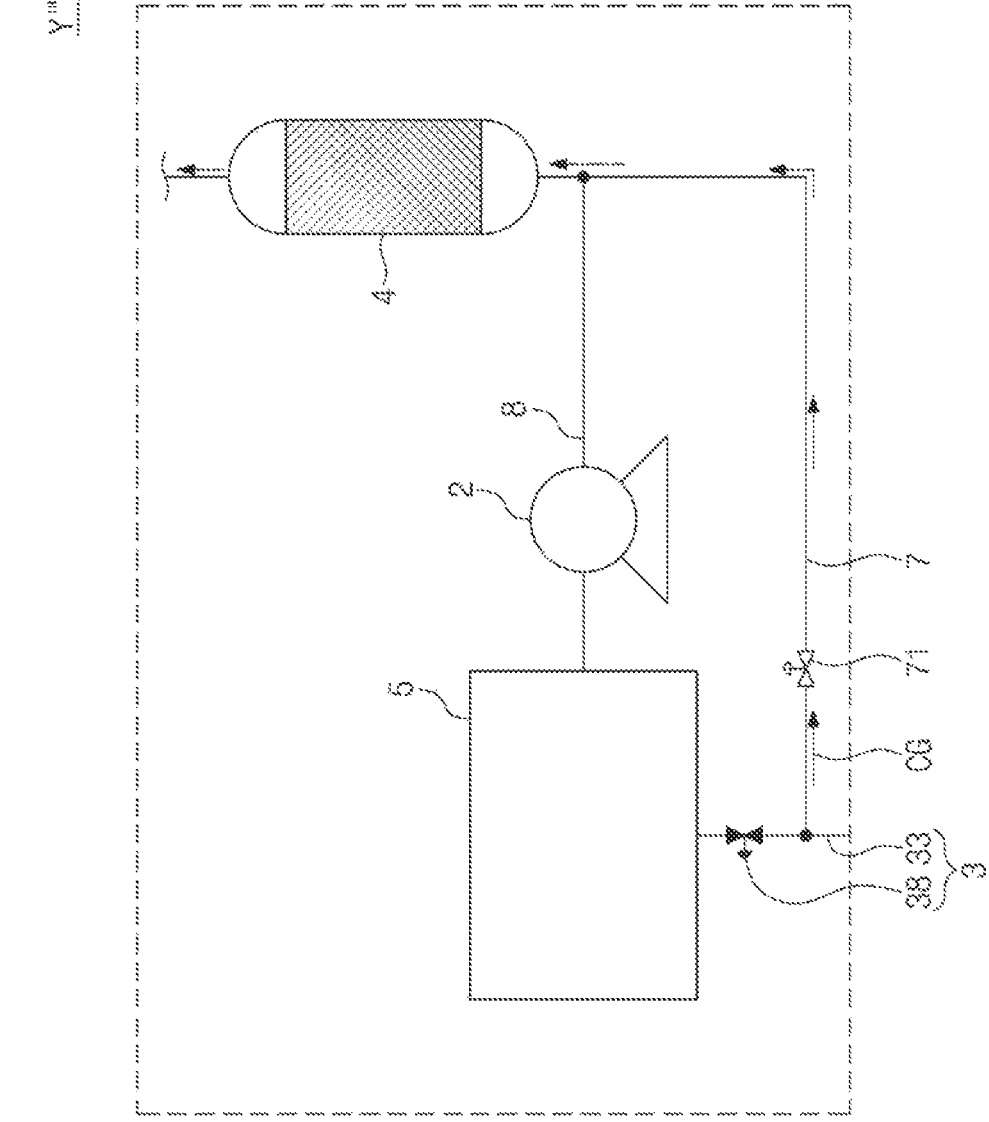

Referring to FIGS. 7, 15, and 16, the purge operation S3 may include supplying the supply pipeline 33 with a cleaning gas CG at a first pressure and allowing the cleaning gas CG supplied to the supply pipeline 33 to escape at a second pressure. In this step, the first valve 32 may be in a closed state. The purge valve 95 may be in an open state. The regulator 34 and the second valve 36 may be in their open states. The shutoff valve 38 may be in a closed state. The bypass valve 71 may be in an open state.

The cleaning gas supply 9 may supply the cleaning gas CG to a front end of the supply pipeline 33. The front end of the supply pipeline 33 may indicate a location where the supply pipeline 33 and the connection pipeline 93 meet each other. The first pressure may range, for example, about 50 psig to about 70 psig. For example, the first pressure may be about 70 psig. The disclosure, however, are not limited thereto.

The step of discharging the cleaning gas CG at the second pressure from the supply pipeline 33 may include applying the second pressure to a back end of the supply pipeline 33. The second pressure may be, for example, an atmospheric pressure. The second pressure may range, for example, about 80 kPa to about 120 kPa. For example, the atmospheric pressure may be about 100 kPa. When the scrubber 4 is exposed to atmospheric environment in a state that the shutoff valve 38 is closed and the bypass valve 71 is opened, the atmospheric pressure may be applied to the back end of the supply pipeline 33. For example, even though there are no separate pump and/or compressor, the second pressure may be applied to the back end of the supply pipeline 33. The atmospheric pressure applied to the back end of the supply pipeline 33 may cause to the cleaning gas CG to move along the supply pipeline 33. The cleaning gas CG may move along the bypass pipeline 7 to bypass the vacuum pump 2. The cleaning gas CG may be exhausted through the scrubber 4.

In some embodiments, the step of supplying the cleaning gas CG at the first pressure to the supply pipeline 33 may be performed simultaneously with the operation of discharging the cleaning gas CG at the second pressure from the supply pipeline 33. For example, the cleaning gas CG may be supplied from the cleaning gas supply 9 to the supply pipeline 33, and at the same time may be discharged from the supply pipeline 33 to the scrubber 4.

In some embodiments, the vacuum application operation S2 and the purge operation S3 may be sequentially and repeatedly performed. For example, after the purge operation S3 is terminated, the vacuum application operation S2 may be performed again. Each of the vacuum application operation S2 and the purge operation S3 may be repeatedly performed three or more times. Each of the vacuum application S2 and the purge operation S3 may be repeatedly performed six times. The disclosure, however, are not limited thereto, and the repetition time may be changed depending on detailed design.

Figure 17:
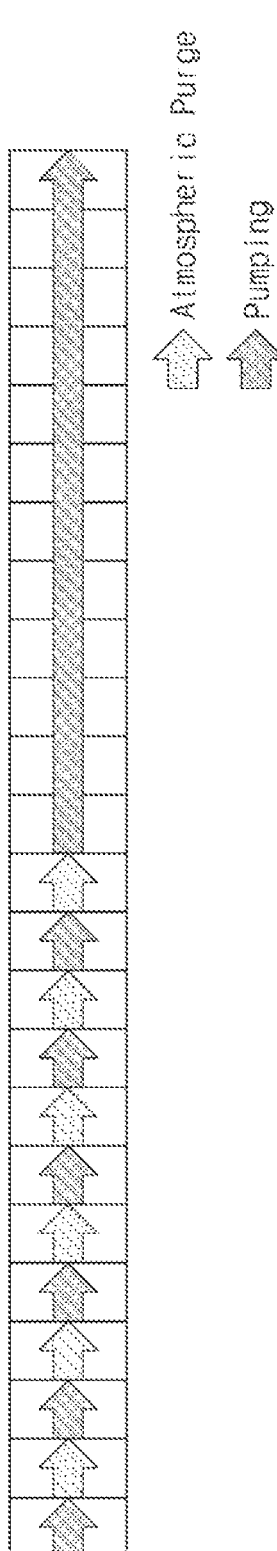
FIG. 17 is a diagram showing a method of cleaning a semiconductor process system in accordance with the flowchart of FIG. 7 according to some embodiments of the disclosure.

FIG. 17 is a diagram showing a method of cleaning a semiconductor process system in accordance with the flowchart of FIG. 7 according to some embodiments of the disclosure.

Referring to FIG. 17, the language "pumping" may indicate the vacuum application operation S2. The term "atmospheric purge" may denote the purge operation S3. Each of the vacuum application operation S2 and the purge operation S3 may be repeatedly performed six times.

In some embodiments, each of the vacuum application operation S2 and the purge operation S3 may be performed for a first time duration. The first time duration may be about 1 hour, but the disclosure is not limited thereto.

Referring back to FIGS. 7 and 17, the vacuum reapplication operation S4 may be performed similarly to the vacuum application operation S2. The vacuum reapplication operation S4 may be executed for a second time duration. The second time duration may be greater than the first time duration. The second time duration may be, for example, about 12 hours. The disclosure, however, are not limited thereto, and the second time duration may be less than about 12 hours.

Figure 18:
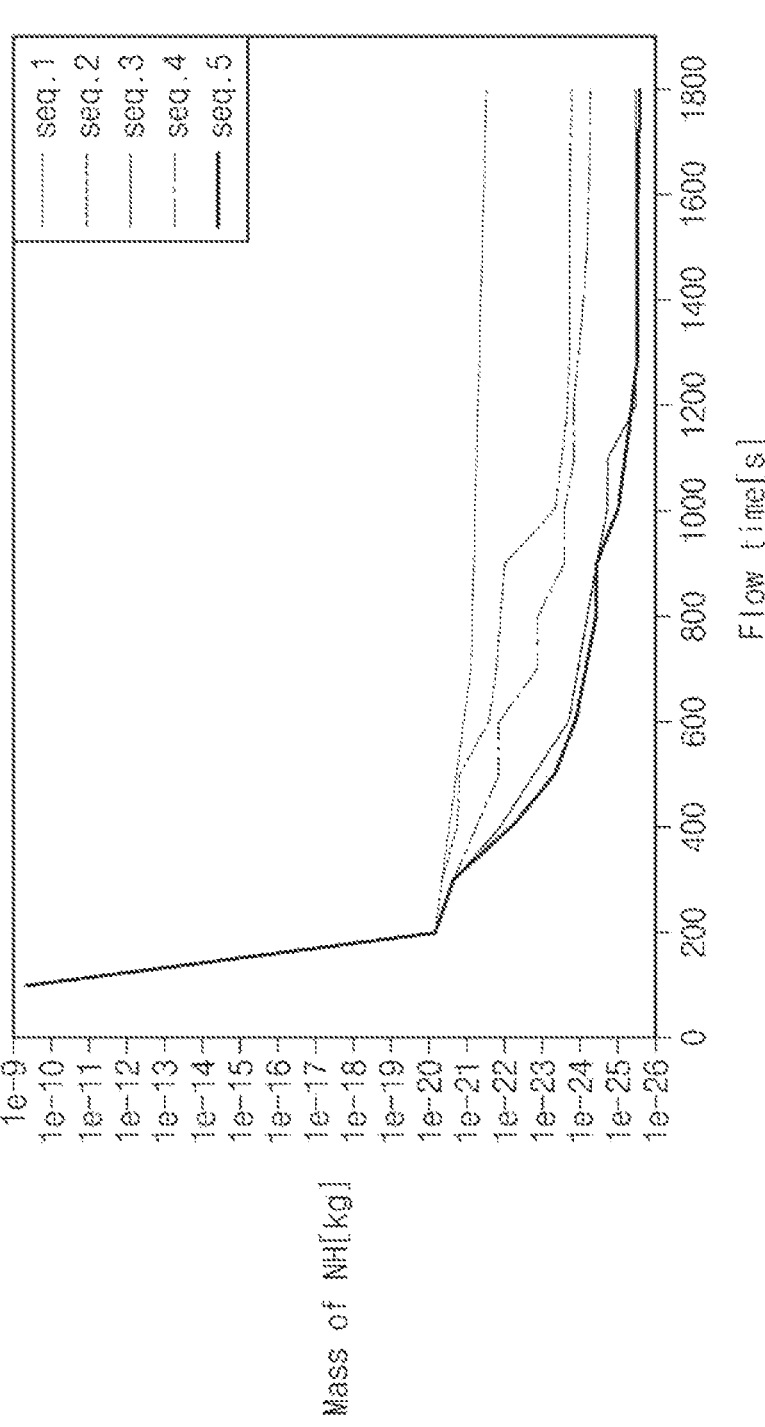
FIG. 18 is a graph showing results from a method of cleaning a semiconductor process system according to some embodiments of the disclosure.

FIG. 18 is a graph showing results from a method of cleaning a semiconductor process system according to some embodiments of the disclosure.

Referring to FIG. 18, a horizontal axis may express a process execution time or a flow time. A unit of the horizontal axis may be second. A vertical axis may indicate the mass of process fluid that remains in a process pipeline. A unit of the vertical axis may be Kg.

The expression "seq. 1" may be a result obtained when each of the vacuum application operation S2 and a vacuum purge operation S3 is performed one time. The vacuum purge may denote that, when a cleaning gas is used to purge, a back end of a supply pipeline is provided not with atmospheric pressure but with vacuum pressure.

The expression "seq. 2" may be a result obtained when each of the vacuum application operation S2 and the vacuum purge operation S3 is performed three times.

The expression "seq. 3" may be a result obtained when each of the vacuum application operation S2 and the vacuum purge operation S3 is performed six times.

The expression "seq. 4" may be a result obtained when each of the vacuum application operation S2 and a pressure purge operation is performed six times.

The expression "seq. 5" may be a result obtained when each of the vacuum application operation S2 and the vacuum purge operation S3 is performed six times. For example, the seq. 5 may be a result obtained when performing the semiconductor process system cleaning method S700 discussed with reference to FIGS. 7 to 16. As shown in graph of FIG. 18, the mass of residual fluid may be minimal in seq. 5.

According to a semiconductor process system and a cleaning method of a semiconductor process system in accordance with some embodiments of the disclosure, a pumping using vacuum pressure and a purging using a cleaning gas may be repeatedly performed. At the transition point between pumping and purging, turbulence may occur in a supply pipeline. Therefore, a residual fluid that remains in a remote place of the supply pipeline may be effectively removed. In addition, the residual fluid may be promptly removed to reduce a process time.

According to a semiconductor process system and its cleaning method in accordance with some embodiments of the disclosure, an atmospheric pressure may be set as a pressure at the back end of the supply pipeline. In this case, a flow rate of fluid in the supply pipeline may not rise above a certain level. Therefore, a residual fluid that remains in a remote place of the supply pipeline may be more effectively removed.

According to a semiconductor process system and its cleaning method in accordance with some embodiments of the disclosure, a bypass pipeline may be additionally provided to promptly and effectively remove a residual fluid. Thus, only a simple apparatus may be added to reduce a process time and to increase efficiency.

Figure 19:
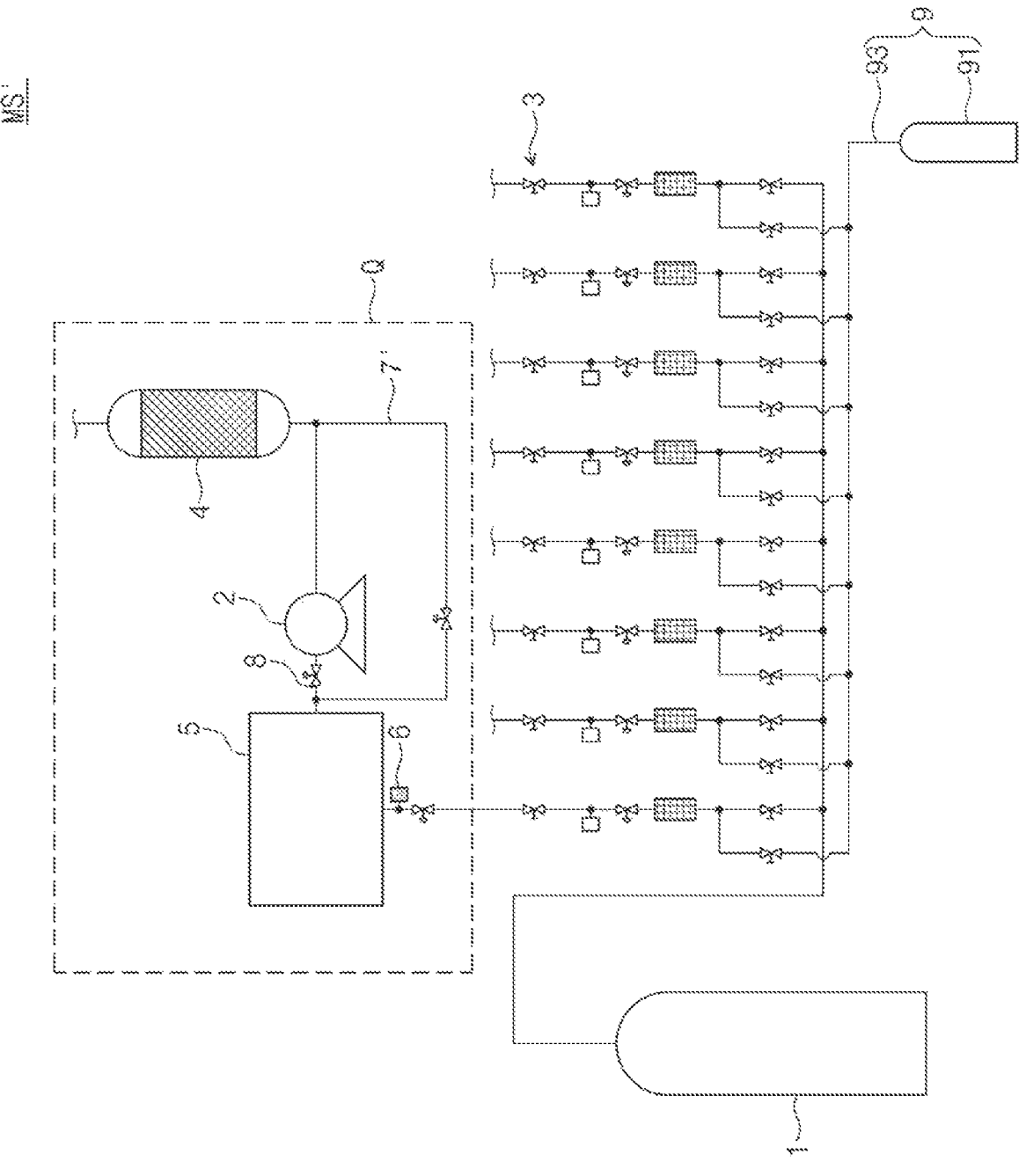
FIG. 19 is a diagram showing a method of cleaning a semiconductor process system according to some embodiments of the disclosure.
Figure 20:
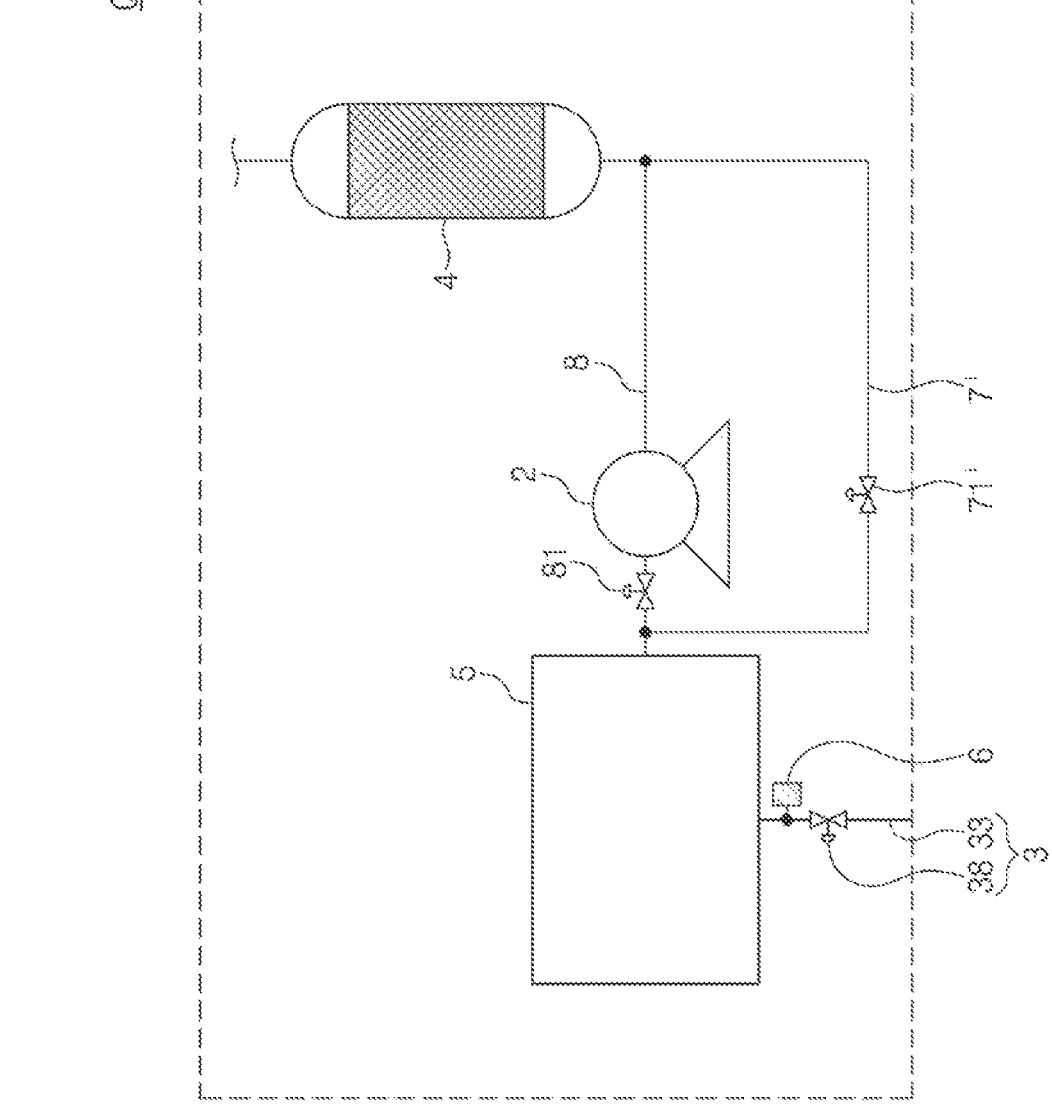
FIG. 20 is a diagram showing section Q of FIG. 19 according to some embodiments of the disclosure.

FIG. 19 is a diagram showing a method of cleaning a semiconductor process system according to some embodiments of the disclosure. FIG. 20 is a diagram showing section Q of FIG. 19 according to some embodiments of the disclosure.

The following will omit a description substantially the same as or similar to that discussed with reference to FIGS. 1 to 18.

Referring to FIGS. 19 and 20, a semiconductor process system MS' may include a bypass pipeline 7' and a flow meter sensor 6.

The bypass pipeline 7' may bypass the vacuum pump 2 to connect the supply pipeline 33 to the scrubber 4. The vacuum pump 2 may not bypass the process chamber 5. For example, one end of the supply pipeline 33 may be connected to the exhaust pipeline 8 between the process chamber 5 and the vacuum pump 2. An exhaust valve 81 may further be provided on the exhaust pipeline 8. The exhaust valve 81 may be positioned between the process chamber 5 and the vacuum pump 2.

The flow meter sensor 6 may be positioned on the supply pipeline 33. For example, the flow meter sensor 6 may be located between the shutoff valve 38 and the process chamber 5.

According to a semiconductor process system and a cleaning method of a semiconductor process system in accordance with some embodiments of the disclosure, a process chamber may be purged with a cleaning gas. Therefore, a process fluid that remains in the process chamber may be effectively removed.

According to a semiconductor process system and a cleaning method of a semiconductor process system in accordance with some embodiments of the disclosure, a residual fluid may be cleaned out to secure worker's safety.

According to a semiconductor process system and a cleaning method of a semiconductor process system in accordance with some embodiments of the disclosure, a residual fluid may be promptly removed to reduce a process time.

According to a semiconductor process system and a cleaning method of a semiconductor process system in accordance with some embodiments of the disclosure, a residual fluid in a remote place of the semiconductor process system may be effectively removed.

According to a semiconductor process system and a cleaning method of a semiconductor process system in accordance with some embodiments of the disclosure, simple equipment and method may be enough to execute.

Effects of the disclosure is not limited to the mentioned above, other effects which have not been mentioned above will be clearly understood to those skilled in the art from the following description.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A method of cleaning a semiconductor process system, the method comprising:

applying a vacuum pressure to a supply pipeline through which a process fluid is transferred to a process chamber; and purging the supply pipeline with a cleaning gas, wherein the purging the supply pipeline with the cleaning gas comprises:

supplying the cleaning gas to a front end of the supply pipeline; and discharging the cleaning gas supplied to the supply pipeline by applying an atmospheric pressure from a back end of the supply pipeline such that the cleaning gas bypasses a vacuum pump connected to the process chamber.

2. The method of claim 1, wherein the applying the vacuum pressure to the supply pipeline and the purging the supply pipeline with the cleaning gas are sequentially and repeatedly performed.

3. The method of claim 1, wherein, in both the applying the vacuum pressure to the supply pipeline and the purging the supply pipeline with the cleaning gas, a fluid discharged from the supply pipeline passes through a scrubber connected to the process chamber.

4. The method of claim 3, wherein applying the vacuum pressure to the supply pipeline is performed using the vacuum pump.

5. The method of claim 1, wherein the cleaning gas comprises nitrogen ($N_2$).

6. The method of claim 1, wherein the atmospheric pressure is in a range of about 80 kPa to about 120 kPa.

7. A method of cleaning a semiconductor process system, the method comprising:

applying a vacuum pressure to a supply pipeline connected to a process chamber; and purging the supply pipeline with a cleaning gas, wherein the purging the supply pipeline with the cleaning gas comprises:

supplying the supply pipeline with the cleaning gas at a first pressure; and discharging the cleaning gas supplied to the supply pipeline by applying a second pressure, wherein the applying the vacuum pressure and the purging the supply pipeline are sequentially and repeatedly performed at least three times, wherein the supplying the cleaning gas and the discharging the cleaning gas are performed at substantially the same time, and wherein the discharging the cleaning gas is performed such that the cleaning gas bypasses a vacuum pump connected to the process chamber.

8. The method of claim 7, wherein the cleaning gas comprises nitrogen ($N_2$).

9. The method of claim 7, wherein the second pressure is an atmospheric pressure.

10. The method of claim 7, wherein applying the vacuum pressure and purging the supply pipeline are sequentially and repeatedly performed six times.

11. The method of claim 7, wherein the discharging the cleaning gas is performed such that the cleaning gas bypasses the process chamber.

12. The method of claim 7, wherein the discharging the cleaning gas is performed such that the cleaning gas passes through the process chamber.

* * * * *